(12) United States Patent  
Endt

(10) Patent No.: US 6,844,731 B2  
(45) Date of Patent: Jan. 18, 2005

(54) MAGNETIC RESONANCE GRADIENT COIL SYSTEM CONTAINING LATENT HEAT STORAGE MATERIAL WHICH UNDERGOES A PHASE TRANSITION DURING OPERATION

(75) Inventor: Axel Vom Endt, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 10/274,863

(22) Filed: Oct. 21, 2002

(65) Prior Publication Data

US 2003/0090268 A1 May 15, 2003

(30) Foreign Application Priority Data

Oct. 19, 2001 (DE) .......................................... 101 51 668

(51) Int. Cl.[7] ................................................ G01V 3/00
(52) U.S. Cl. .................................... 324/318; 324/319
(58) Field of Search ................................ 324/318, 319, 324/322, 309, 307, 321, 314; 600/410

(56) References Cited

U.S. PATENT DOCUMENTS

| | | | |
|---|---|---|---|
| 4,520,862 A | * | 6/1985 | Helmbold ..................... 165/10 |
| 5,570,021 A | * | 10/1996 | Dachniwskyj et al. ...... 324/318 |
| 6,111,412 A | | 8/2000 | Boemmel et al. |
| 6,615,906 B1 | * | 9/2003 | Fieback et al. ............... 165/10 |

FOREIGN PATENT DOCUMENTS

| | | |
|---|---|---|
| DE | 197 22 211 | 8/1998 |
| DE | 198 03 419 | 8/1999 |
| DE | 198 58 794 | 2/2000 |
| DE | 198 39 987 | 3/2000 |
| GB | 2 342 986 | 4/2000 |
| WO | WO 89/00766 | 1/1989 |

* cited by examiner

*Primary Examiner*—Brij B. Shrivastav  
(74) *Attorney, Agent, or Firm*—Schiff Hardin LLP

(57) ABSTRACT

A gradient coil system for a magnetic resonance apparatus has at least one component of a cooling apparatus, and a latent heat storage apparatus which undergoes a phase transition during operation of the gradient coil system.

9 Claims, 1 Drawing Sheet

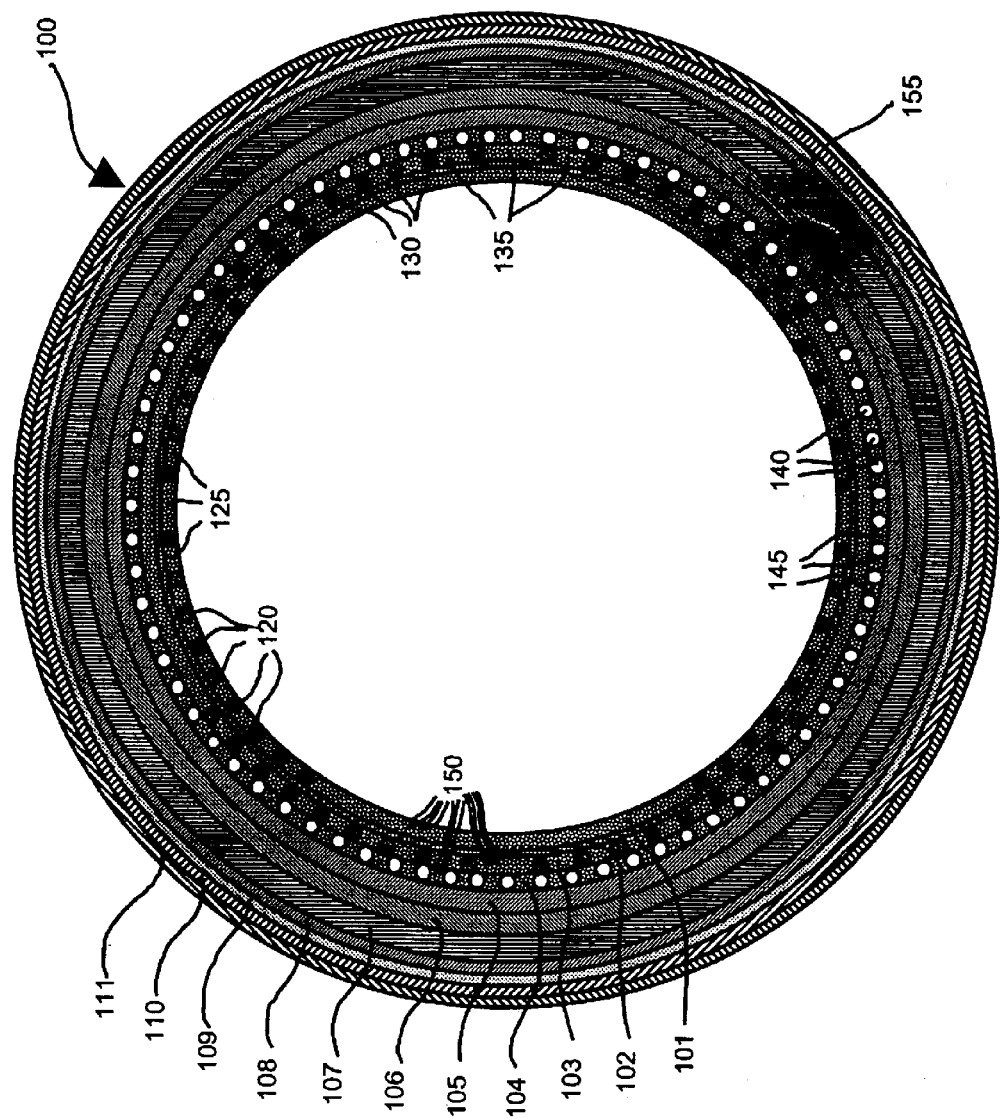

MAGNETIC RESONANCE GRADIENT COIL SYSTEM CONTAINING LATENT HEAT STORAGE MATERIAL WHICH UNDERGOES A PHASE TRANSITION DURING OPERATION

BACKGROUND OF THE INVENTION

1. Field of the Invention

The invention relates to a gradient coil system for a magnetic resonance appliance.

2. Description of the Prior Art

Magnetic resonance technology is a known technique for obtaining images of the interior of the body of an object being investigated. Rapidly switched gradient fields, which are produced by a gradient system, are superimposed in a magnetic resonance apparatus on a static basic magnetic field which is produced by a basic field magnet. The magnetic resonance apparatus furthermore has a radio-frequency system, which emits radio-frequency signals into the object being investigated in order to excite magnetic resonance signals, and which receives the resulting magnetic resonance signals, on the basis of which magnetic resonance images are produced.

In many embodiments, the gradient coil system has an encapsulation, for example composed of synthetic resin, inter alia to achieve a high dielectric strength and high structural strength. In order to produce the gradient fields during operation, currents flow in the gradient coils of the gradient coil system, having amplitudes reaching several hundred amperes and which are subject to frequent and rapid changes in the current direction with rise and fall rates of several hundred thousand amperes per second. The driving voltage for the coil current is up to several kilovolts. In order to cope with the abovementioned high electrical power levels, it is known for the gradient coil system to be cooled during the operation of the gradient coils. For this purpose, for example, a cooling apparatus can be used which transports heat, which is produced by virtue of current flowing in the gradient coils, out of the coil.

For this purpose, German OS 197 21 985 and OS 197 22 211 A1 disclose examples of a cooling device for indirect cooling of conductors in the gradient coil. In this case, a flexible cooling line, which is laid with its sections closely against one another and through which a cooling medium is passed in order to cool the gradient coil, is introduced in a flat carrier, which is then curved in the form of a cylindrical casing for a hollow cylindrical gradient coil system, and which is encapsulated with casting resin.

Another known arrangement for cooling a gradient coil is described in German OS 198 39 987. In this case, a conductor of the gradient coil is cooled directly by passing a cooling medium through an inner cooling channel, which is surrounded by the conductor in the form of a profiled segment conductor.

German OS 198 03 419 discloses an apparatus for stimulation of body tissues by a magnet coil arrangement which can be placed on a surface of a body and which has a latent heat store which passes through a phase transition within a temperature range of between 0° and 50° C., preferably within a temperature range between 180 and 40° C., and particularly within a temperature range between 200 and 37° C.

German OS 198 58 794 discloses a latent heat body with paraffin-based latent heat storage material, which is held in spaces of a base material. Capillary accommodation spaces for the latent heat storage material are formed within the base material, and the base material contains a mineral substance with an open capillary pore structure. The base material may contain diatomaceous earth, for example. The latent heat body can be used for a wide range of tasks in the form of panels, building blocks, granulates or further shapes.

SUMMARY OF THE INVENTION

An object of the present invention is to provide an improved gradient coil system for a magnetic resonance apparatus, which, inter alia, has better performance.

The object is achieved according to the invention in a gradient coil system for a magnetic resonance apparatus having at least one component of a cooling apparatus, and a latent heat storage apparatus which passes through a phase transition during operation of the gradient coil system.

The invention is based on the knowledge that, in a gradient coil system which is provided with a cooling apparatus, it is possible to distinguish between a maximum pulsed power and a maximum continuous power, with the majority of the pulsed power being absorbed by the thermal capacity of the gradient coil system while, in contrast, the design of the cooling apparatus is the critical factor for the continuous power. According to the invention, the thermal capacity of the gradient coil system is increased by using a latent heat storage apparatus which passes through a phase transition, allowing the maximum pulsed power to be increased without influencing the continuous power. This is a major advantage especially in the case of gradient coil systems, which are subject to extreme pulsed loads during operation. As an example, the latent heat granulate RUBITHERM®, which is paraffin-based and is available from the company RUBITHERM GmbH in Hamburg, can be used to form the latent heat storage apparatus.

DESCRIPTION OF THE DRAWINGS

The single FIGURE is a section through a gradient coil system 100 which is essentially in the form of a hollow cylinder.

DESCRIPTION OF THE PREFERRED EMBODIMENTS

The gradient coil system 100 has the areas 101 to 111, proceeding in sequence from the inside to the outside, which are arranged concentrically in the form of hollow circular cylinders.

A first transverse gradient coil is arranged in the first area 101. In this case, as an example, the illustration shows conductors 120 of the first transverse gradient coil. A latent heat granulate 150 is arranged as part of a latent heat storage apparatus in intermediate spaces 125 in the first area 101, between the conductors 120. In this case, the latent heat granulate 150 is fixed, for example by means of a casting resin, before encapsulation of the gradient coil system 100 such that it remains at the intended points during the encapsulation process. This may be achieved, for example, using appropriately fixed bag-like meshes filled with latent heat granulate 150.

The second area 102 acts, inter alia, as an insulation layer of adequate dielectric strength between the first area 101 of the first transverse gradient coil and the third area 103 of a second transverse gradient coil. The second area 102 is in this case formed by the casting resin during the encapsulation process. In order to ensure an adequate dielectric strength, when using a latent heat granulate 150 with a lower dielectric strength than that of the casting resin in the second area 102, it may be necessary to take into account the fact that, dependent on the characteristics of the latent heat granulate 150 being used, there may be regions where no latent heat granulate 150 is also encapsulated.

Conductors 130 of the gradient coil are illustrated as an example for the second transverse gradient coil, which is arranged in the third area 103 of the gradient coil system 100. The description relating to the first area 101 applies as well to the latent heat granulate 150 which is arranged in the intermediate spaces 135 between the conductors 130 in the third area 103. Cooling lines 140 of a cooling apparatus for the gradient coil system 100 are laid, for circulating a cooling medium in the fourth area 104 of the gradient coil system 100. The description relating to the first area 101 applies in a corresponding manner to the latent heat granulate 150 which is arranged in the intermediate spaces 145 between the cooling lines 140 in the fourth area 104.

A longitudinal gradient coil is arranged in the fifth area 105 of the gradient coil system 100. The description relating to the first area 101 applies as well to the latent heat granulate which is arranged in intermediate spaces between conductors of the longitudinal gradient coil in the fifth area 105.

Shim coils, inter alia, are arranged in the sixth area 106 of the gradient coil system 100. The description relating to the first area 101 applies as well to the latent heat granulate which is arranged in the intermediate spaces between conductors of shim coils in the sixth area 106.

Further cooling lines, which are not illustrated, of the cooling apparatus are arranged in the seventh area 107 of the gradient coil system 100, with the seventh area 107 being formed in a corresponding manner to the fourth area 104.

A longitudinal shielding coil, which is associated with the longitudinal gradient coil, is arranged in the eighth area 108 of the gradient coil system 100.

A latent heat storage layer 155, which is in the form of a hollow circular cylinder, is arranged as a part of the latent heat storage apparatus in the ninth area 109 of the gradient coil system 100, between the eighth area 108 of the longitudinal shielding coil and the tenth area 110 of a first transverse shielding coil, for example by placing an appropriate sheet of a latent heat material around the eighth area 108.

The first transverse shielding coil, which is associated with the first transverse gradient coil, is arranged in the tenth area 110 of the gradient coil system 100.

Finally, a second transverse shielding coil, which is associated with the second transverse gradient coil, is arranged in the eleventh area 111.

The gradient coil system 100 is encapsulated as an entity with casting resin. In order to achieve a gradient coil system 100 with a higher pulsed power than a comparable gradient coil system according to the prior art, the latent heat storage apparatus is also encapsulated, as described above. In this case, the phase transition of the latent heat storage apparatus is designed in particular such that it is in a temperature range between about 50° and 80° C.

In other embodiments, the latent heat storage layer 155 is arranged between other areas 101 to 111 of the gradient coils system 100, and/or a number of such layers are provided at different installation locations. Furthermore, with regard to the shielding coils as well, further parts of the latent heat storage apparatus can be arranged between the conductors of the shielding coils. In the presence of a suitable latent heat granulate, in particular a latent heat granulate which has adequate dielectric strength, or if there is a sufficient distance between the areas 101, 103, 105, 106, 108, 110 and 111 of individual coils, the latent heat also granulate may be added to the encapsulation material during encapsulation of the gradient coil system 100. The above description applies as well to gradient coil systems in the form of disks and/or plates.

Although modifications and changes may be suggested by those skilled in the art, it is the intention of the inventors to embody within the patent warranted hereon all changes and modifications as reasonably and properly come within the scope of their contribution to the art.

I claim as my invention:

1. A gradient coil system for a magnetic resonance apparatus, comprising:

at least one gradient coil which generates heat during operation thereof;
at least one component of a cooling apparatus in thermal communication with said gradient coil; and
a latent heat storage material, which undergoes a phase transition during said operation, in thermal communication with said gradient coil.

2. A gradient coil system as claimed in claim 1 wherein said material undergoes said phase transition in a temperature range between about 50° C. and about 80° C.

3. A gradient coil system as claimed in claim 1 wherein said material forms a layer relative to said at least one gradient coil.

4. A gradient coil system as claimed in claim 3 comprising two gradient coils spaced from each other with said layer disposed between said two gradient coils.

5. A gradient coil system as claimed in claim 1 wherein said material is a granulate material.

6. A gradient coil system as claimed in claim 5 wherein said at least one gradient coil has coil windings with intermediate spaces therebetween, and wherein said granulate material is disposed in at least some of said intermediate spaces.

7. A gradient coil system as claimed in claim 5 wherein said component of said cooling apparatus contains intermediate spaces, and wherein said granulate material is disposed in at least some of said intermediate spaces.

8. A gradient coil system as claimed in claim 1 wherein said component of said cooling apparatus is a cooling line adapted to carry a cooling medium therein.

9. A gradient coil system as claimed in claim 1 wherein said at least one gradient coil, said component of said cooling system and said material form a hollow cylinder.

* * * * *